(12) United States Patent
Kubota et al.

(10) Patent No.: US 6,501,014 B1
(45) Date of Patent: Dec. 31, 2002

(54) COATED ARTICLE AND SOLAR BATTERY MODULE

(75) Inventors: Yuichi Kubota, Tokyo (JP); Michio Arai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/680,267

(22) Filed: Oct. 6, 2000

(30) Foreign Application Priority Data

Oct. 8, 1999 (JP) .......................................... 11-287867

(51) Int. Cl.[7] ..................... H01L 31/04; H01L 31/0216; H01L 31/042
(52) U.S. Cl. ...................... 136/256; 428/917; 428/412; 428/430; 428/433; 428/426; 428/446; 428/451; 428/688; 427/397.7; 427/376.2; 427/377; 501/53; 501/133; 257/79; 257/434; 257/436; 362/800; 136/251
(58) Field of Search ................... 136/251, 256; 428/917, 412, 430, 433, 426, 446, 451, 688; 362/800; 427/397.7, 376.2, 377; 501/53, 133; 257/79, 434, 436

(56) References Cited

U.S. PATENT DOCUMENTS

| | | | | |
|---|---|---|---|---|
| 5,770,260 A | * | 6/1998 | Fukuyama et al. | 427/226 |
| 5,858,541 A | * | 1/1999 | Hiraoka et al. | 428/429 |
| 5,914,151 A | * | 6/1999 | Usuki | 427/128 |
| 6,238,800 B1 | * | 5/2001 | Nishimura | 428/428 |
| 2002/0113241 A1 | * | 8/2002 | Kubota et al. | 257/79 |

FOREIGN PATENT DOCUMENTS

| | | | | |
|---|---|---|---|---|
| EP | 781815 A1 | * | 7/1997 | |
| EP | 807980 A2 | * | 11/1997 | |
| JP | 8-136940 A | * | 5/1996 | |
| JP | 8-236274 A | * | 9/1996 | |
| JP | 8-236274 | | 9/1996 | |
| JP | 9-199740 A | * | 7/1997 | |
| JP | 11-54266 A | * | 2/1999 | |
| JP | 11-78515 A | * | 3/1999 | |
| JP | 11-170428 A | * | 6/1999 | |
| JP | 11-248906 A | * | 9/1999 | |

OTHER PUBLICATIONS

Denpa Shinbun, 1 page, "Plastic Film Used as Substrate", Sep. 30, 2000.

* cited by examiner

*Primary Examiner*—Alan Diamond
(74) *Attorney, Agent, or Firm*—Oblon, Spivak, McClelland, Maier & Neustadt, P.C.

(57) ABSTRACT

An object of the invention is to provide a coated article having a protective member which is improved in light transparency, heat resistance, and weather resistance, and easy to manufacture, as typified by a solar battery module which experience no deterioration of performance during long-term outdoor installation; and to provide a coated article capable of protecting a functional film or device from water vapor and gases for dramatically improve the life of the functional film or device. These objects are achieved by a coated article having as a protective member a silica coating which is obtained by applying a polysilazane-containing coating solution on at least one surface of a resinous substrate having light transparency and heat resistance under atmospheric pressure, followed by steam oxidation and heat treatment.

18 Claims, 3 Drawing Sheets

COATED ARTICLE AND SOLAR BATTERY MODULE

BACKGROUND OF THE INVENTION

1. Technical Field

This invention relates to a coated article comprising a member such as a protective member having light transparency, weather resistance, heat resistance and electrical insulation or a protective member having improved substrate passivation properties, and especially, to a solar battery module using the same.

2. Background Art

From the past, a variety of polymeric materials have been investigated as a protective member on module sheets requiring light transparency and weather resistance and themselves having flexibility, and having to be wound up and extended as used in solar batteries or the like.

For example, JP-A 1-198081 discloses an integrated a-Si solar battery in the form of a module sheet comprising a polymeric film support, thin film solar cells formed thereon, and a protective film layer stacked thereon with an intervening buffer adhesive film layer of a thermoplastic polymer, wherein the sheet has a thickness of less than 1000 $\mu$m and a flexural modulus, as measured on a sample of 5 mm wide, of up to 100 kg-mm$^2$, preferably up to 10 kg-mm$^2$. The solar battery is repeatedly foldable and flexible so that the solar battery can be wound up into a compact roll when unnecessary without damaging the solar battery, and extended flat for operation when necessary.

Also, Japanese Patent Application No. 10-54498 of the present applicant describes a solar battery which is laminated to at least one surface of a substrate made of a resin having light transparency and heat resistance, using a hot melt member having a buffer adhesive layer containing a thermosetting resin.

These protective members of polymers (i.e., resins), however, sometimes fail to provide sufficient strength because polymers necessarily contain, by reason of synthesis, oligomers having a lower degree of polymerization which are considered to become sites where degradation begins. Also polymers have a limit on their heat resistance even when they are heat resistant. For example, when heated by direct exposure to sunlight, polymer film undergoes thermal shrinkage or expansion, which can eventually cause device deformation or delamination. When polymers are used in film form, problems of warp, crease, waviness and sagging occur. Further, since solar batteries to be installed outdoor for a long term are exposed to rain and wind as well as heat, they must be improved in weathering properties including water absorption, moisture permeability, oxygen permeability, barrier properties against gases including corrosive gases such as $NO_x$, and hydrolytic degradation of polymers by interaction with UV light. Also, since solar batteries function upon receipt of light, typically sunlight, it is prohibited to use a material that can adversely affect the light transparency of a light receiving surface. Where flexibility must be maintained, it also becomes a restrictive factor.

When highly heat resistant films such as polyimide and aramides films are used as the substrate, these films which are strongly hydrophilic absorb water or moisture and give rise to outgassing in a vacuum deposition step of a solar battery module fabrication process. As a result of outgassing, electrodes and thin films such as photoelectric conversion films are deteriorated in quality; thin film laminates including substrates are curled, warped or waved; and factors associated with dimensions and shape deformation including a heat shrinkage factor and a coefficient of linear expansion are adversely affected.

Such protective members requiring light transparency, weather resistance, heat resistance, gas barrier properties, water (or moisture) non-absorbing properties, chemical separation resistance and the like are not only employed in solar batteries, but are also required in electronic device applications such as optical discs, liquid crystal panel displays, and EL displays and agricultural material applications such as vinyl chloride substitutes in agricultural green houses.

SUMMARY OF THE INVENTION

An object of the invention is to provide a coated article which is improved in light transparency, heat resistance, passivating properties (such as gas barrier properties, oligomer release prevention and outgassing minimization), water (or moisture) non-absorbing properties, stability against chemical degradation, dimensional shape stability, surface anti-reflection, electrical insulation, UV degradation resistance and weather resistance, and has such a member as a protective member featuring high productivity as typified by possible deposition under atmospheric pressure; and a coated article having such a member as a protective member imposing a minimized burden to the environment. Another object is to provide a solar battery module comprising a member such as a protective member as mentioned above, and experiencing little or no loss of performance for a long term of outdoor installation.

A further object is to provide a transparent flexible support suited for use in organic EL displays, and an organic EL display using the support.

These and other objects of the invention are achieved by the present invention which is defined below.

(1) A coated article comprising a substrate made of a resin having light transparency and heat resistance, stainless steel base metal material or glass, and a silica coating formed on at least one surface of the substrate by applying a polysilazane-containing coating solution under atmospheric pressure, followed by oxidizing treatment.

(2) The coated article of (1) wherein the polysilazane is perhydropolysilazane.

(3) The coated article of (1) wherein said silica coating has a thickness of 0.01 to 15 $\mu$m.

(4) The coated article of (1) wherein said substrate is made of a resin having a glass transition temperature of at least 65° C. or a heat resisting temperature of at least 70° C.

(5) The coated article of (1) wherein said silica coating further has UV absorbing properties.

(6) The coated article of (1) wherein said silica coating further contains UV-absorbing inorganic microparticulates and/or an UV long wavelength-fluorescence converting organic compound or organic metal complex molecule.

(7) The coated article of (1) wherein said silica coating is stacked with an organic UV absorber-containing resin coating layer or a UV-absorbing polymer coating layer.

(8) The coated article of (1) wherein said substrate is made of at least a polymethyl methacrylate resin, polycarbonate resin, amorphous polyolefin resin or polyester resin.

(9) The coated article of (6) wherein said UV-absorbing inorganic microparticulates are ZnO microparticulates.

(10) The coated article of (1) wherein said silica coating is formed on one or either surface of said substrate for blocking the discharge of an outgassing component or oligomer in the substrate made of a water absorbing, moisture permeable or oxygen permeable resin film, so that the coated article functions as a passivation film and is used as a substrate for vacuum deposition.

(11) The coated article of (1) wherein said silica coating is formed on one or either surface of said substrate, wherein by virtue of the heat resistance, modulus of elasticity and low heat shrinkage factor of said silica coating, when another functional film is deposited and laid thereon under atmospheric pressure or vacuum, the coated article serves as a film depositing substrate capable of maintaining the dimensional precision, suppressing the heat deformation and maintaining the flatness of the substrate.

(12) A solar battery module comprising the coated article of (1).

(13) The solar battery module of (12) wherein said substrate has the silica coating on one surface thereof and a buffer adhesive layer on another surface thereof, and said module has the silica coat-bearing substrate attached as a protective member through the buffer adhesive layer.

(14) The solar battery module of (13) which has the protective member on at least a light-receiving side.

(15) The solar battery module of (14) which has the protective member on both the light-receiving side and an opposite side.

(16) The solar battery module of (12) which has a member comprising a substrate made of a stainless steel base metal material and a silica coating formed on one or either surface thereof as an insulating flat film.

(17) The solar battery module of (12) which has a member comprising a substrate made of soda glass and a silica coating formed on one or either surface thereof as a $Na^+$ non-migrating film.

DESCRIPTION OF THE PREFERRED EMBODIMENT

Now the invention is described in detail.

The coated article of the invention includes a substrate made of a resin having light transparency and heat resistance or a substrate of stainless steel base metal material such as stainless steel (typically metal foil), and a silica coating on at least one surface of the substrate. The silica coating is formed by applying a coating solution of a polysilazane such as perhydro-polysilazane in a solvent such as xylene to the substrate surface, and effecting oxidation, that is, steam oxidation and separately or simultaneously or subsequently effecting heat treatment in air. The substrate may be present as a protective member (e.g., protective film) for the coated article such as various electronic devices, or as a constituent member such as a support.

When a silica coating as mentioned above is formed on a resin substrate, for example, many properties can be improved while maintaining the flexibility of the resin. Such improvements are an improvement in heat resistance, maintenance of or improvement in light transparency, improvement in substrate passivation, water (or moisture) anti-absorption, chemical degradation, dimensional shape stability, UV light degradation resistance, and surface reflection reduction. Weather resistance is endowed as an interaction of these improvements. Specifically, since the permeability to water vapor and oxygen becomes extremely low, electronic devices by way of example are prevented from performance degradation by water vapor and oxygen and given a longer lifetime. Also, there is obtained a dense coating which is improved in strength and corrosion resistance. Further the coating is flat so that it does not lower light transparency or exacerbate the function of electronic devices that operate with light. Additionally, the adhesion between the substrate and the silica coating is satisfactory.

The silica coating also provides passivation between the substrate or functional films formed on the substrate, for example, optical functional films such as filters and functional thin-films formed thereon such as semiconductor layers, electrode layers and light emitting layers, protecting the functional thin-films from water and gases released from the substrate and the functional film formed thereon.

Further, the silica coating is formed by applying a coating solution of a polysilazane such as perhydro-polysilazane, followed by steam oxidation and heat treatment (inclusive of drying treatment). This method is advantageous in that even on the resin substrate which is generally less heat resistant, the silica coating can be formed under atmospheric pressure by a highly efficient production technique, typically wet coating technique. Methods of forming a silica coating at low temperature include CVD and PVD techniques, and as compared with these techniques, the inventive method is film formation based on atmospheric application without resorting to a special equipment associated with a vacuum deposition apparatus and thus offers advantages of easy manufacture, improved productivity and cost reduction. For this reason, the silica coating can be easily formed even on a substrate having already formed thereon a filter layer or undercoat, with the damage to the filter layer or undercoat being minimized.

Also on the substrate in the form of a metal foil or film of stainless steel, for example, which has been precision rolled to a gage of about 100 to about 25 $\mu$m, an electrically insulating coating can be formed by applying thereto a polysilazane solution, as mentioned above, under atmospheric pressure and successively effecting steam oxidation, hot air drying and heat treatment (below 250° C.). The electrically insulating coating is flat, smooth, and improved in water (or moisture) absorption, passivation, chemical stability, and surface strength (hardness). The coating is heat resistant even at temperatures in excess of 1000° C. The coating surface has such wear resistance as to be applicable to mechanical slide parts and becomes a solar battery substrate on which a silicon crystal is to be grown. In an application where flexibility is not so required, glass may be used as the substrate. The coating of soda glass with silica prevents Na$^+$ ions from being dissolved out. When immersed in pure water at 100° C. for about 24 hours, the silica coating of polysilazane restricts the amount of Na$^+$ dissolved out of soda glass to a level below 1.6 wt %, which is equivalent to alkali-free glass, indicating optimum application as a solar battery substrate.

Aside from the solar batteries, these substrates can be used in electronic device applications such as optical discs, liquid crystal panel displays, and EL displays (organic EL devices) and agricultural material applications such as vinyl chloride substitutes in agricultural green houses.

Examples of the substrate made of a resin having a glass transition temperature Tg of at least 65° C. and/or a heat resisting temperature of at least 70° C. as well as light transparency and heat resistance include polyethylene terephthalate film (Tg 69° C.), polyethylene naphthalate heat resistant film (Tg 113° C.); fluorinated films, for example, homopolymers such as ethylene trifluoride chloride resin (PCTFE, Neofron CTFE by Daikin Industry K.K.) (heat resisting temperature 150° C.), polyvinylidene fluoride (PVDF, Denka DX film by Denki Kagaku Kogyo K.K.) (heat resisting temperature 150° C., Tg 50° C.), and polyvinyl fluoride (PVF, Tedlar PVF film by E. I. Dupont) (heat resisting temperature 100° C.), and copolymers such as ethylene tetrafluoride-perfluorovinyl ether copolymers (PFA, Neofron PFA film by Daikin Industry K.K.) (heat resisting temperature 260° C.), ethylene tetrafluoride-propylene hexafluoride copolymers (FEP, Toyofron film FEP type by Toray K.K.) (heat resisting temperature 200° C.), ethylene tetrafluoride-ethylene copolymers (ETFE, Tefzel ETFE film by E. I. Dupont) (heat resisting temperature 150° C.) and AFLEX film by Asahi Glass K.K., Tg 83° C.); aromatic dicarboxylic acid-bisphenol copolymer aromatic polyester (PAR, casting) such as polyacrylate film such as Elmeck by Kanegafuchi Chemical K.K. (heat resisting temperature 290° C., Tg 215° C.); sulfur-containing polymer films such as polysulfone (PSF, Sumilite FS-1200 by Sumitomo Bakelite K.K.) (Tg 190° C.) and polyether sulfone (PES, Sumilite FS-1300 by Sumitomo Bakelite K.K.) (Tg 223° C.); polycarbonate films (PC, Panlite by Teijin Chemicals K.K.) (Tg 150° C.); amorphous polyolefin resins (APO, available from Mitsui Chemical K.K.), cycloolefin resins (Zeonoa by Nippon Zeon K.K.) (Tg 105–163° C.), functional norbornene resin (ARTON by JSR K.K.) (heat resisting temperature 164° C., Tg 171° C.); polymethacrylate resin (PMMA, available from Mitsubishi Rayon K.K. and Sumitomo Chemical K.K., Tg 80–114° C.), olefin-maleimide copolymer (TI-160 by Toso K.K., Tg $\geq$150° C.), para-aramides (Aramica R by Asahi Chemicals K.K., heat resisting temperature 200° C.), fluorinated polyimide (heat resisting temperature $\geq$200° C.), polystyrene (Tg 90° C.), polyvinyl chloride (Tg 70–80° C.), and cellulose triacetate (Tg 107° C.).

An appropriate choice may be made among these depending on a particular purpose and application. Non-halogenated resins are preferable especially for environment cleaning purposes, and specifically, polymethyl methacrylate resins, polycarbonate resins, amorphous polyolefin resins, and polyester resins having good transparency, heat resistance and weather resistance are preferable. It is preferred to use these specified resins as at least a part of the substrate. In particular, since the polymethyl methacrylate resins are usually water absorbing, a combination of a polymethyl methacrylate resin film with a silica passivation film formed on at least one surface thereof by low-temperature wet coating of polysilazane is advantageous from the standpoint of economic treatment of a long and wide film.

The glass transition temperature Tg of the resin substrate is at least 65° C., preferably at least 70° C., more preferably at least 80° C., and especially at least 110° C., while its upper limit is not particularly prescribed, but is usually about 130° C. The heat resisting temperature or continuous service temperature is at least 80° C., preferably at least 100° C., and especially at least 110° C., while its upper limit (the higher, the better) is not particularly prescribed but is usually about 250° C. However, a heat resisting temperature of at least 80° C. is satisfactory as the protective member (e.g., resin substrate for laminate film). The thickness of the resin substrate is determined as appropriate depending on a particular purpose and application and the required strength, flexural rigidity or the like. The thickness is usually in the range of 5 to 150 μm, preferably in the range of 35 to 135 μm when the substrate is used as a protective member. In general, the resin substrate becomes less effective for surface protection as it becomes thinner, and inversely, becomes low in light transmittance as it becomes thicker. It is noted that PMMA (Technolloy R526 by Sumitomo Chemical K.K.) has a light transmittance of slightly below 94% at a thickness of 125 μm.

By the term "light transparency" it is meant that at least 70%, preferably at least 80% of light in the visible spectrum is transmitted.

The resin substrate preferably has a molecular orientation ratio (MOR) of 1.0 to 3.0, more preferably 1.0 to 2.0, and especially 1.0 to 1.8. With MOR within the range, the coated article undergoes less deformation. The detail of MOR or molecular orientation ratio is described, for example, in OHSAKI Shigeyoshi, "Quality control of film and sheet with a microwave molecular orientation instrument applied," Compartech, March 1998, and ZUSI Yasunobu, NIWA Takahiro, HIBI Sadao, NAGATA Shinichi & TANI Tomohito, "Molecular orientation behavior concomitant with biaxial orientation," Seikei-Kakou, Vol. 7, No. 11, 1995. A greater MOR value indicates greater anisotropy, with the value of 1.0 representing random orientation.

With respect to the molecular orientation ratio, a common resin film sometimes has different MOR values at different sites. Especially a film prepared by a biaxial orientation method tends to have a higher MOR value at the edge of the film which has been clamped for stretching. For this reason, even in the event of a resin having a good molecular orientation ratio, it is recommended that a resin film is examined for molecular orientation ratio at different sites and confirmed to have MOR values within the above-defined range, prior to use.

MOR is measured, for example, by measuring the intensity of microwave transmitted by a sample while rotating the sample. More particularly, the interaction of bipoles of a high molecular weight compound with a microwave field of a certain frequency is related to the inner product of vectors of both. Upon rotation of the sample in the microwave polarization field, the intensity of transmitted microwave changes due to the anisotropy of dielectric constant. As a consequence, a molecular orientation ratio is determined. The microwave used in this measurement is not critical, and is usually of 4 GHz or 12 GHz. The instrument having the principle incorporated therein is available under the trade name of molecular orientation meter MOA-5001A, 5012A, and MOA-3001A/3012A from Shin-Oji Paper K.K. Besides, the MOR can be determined by X-ray diffraction, infrared dichroic, polarized fluorescence, ultrasonic, optical, NMR and other methods.

The silica coating formed on the resin substrate according to the invention originates from polysilazane. The silica coating preferably has a thickness of about 0.01 to 15 μm, and more preferably about 0.05 to 10 μm. The coating thickness within the range ensures the full function of a protective film and has a degree of flexibility in the application requiring flexibility. Outside the range, too thin a coating may fail to function as a protective film whereas too thick a coating may impede flexibility in the application requiring flexibility.

The sol-gel method of forming a silica coating, which is typical wet coating, requires firing near 450° C. in air for conversion into silica, which entails a substantial weight loss due to elimination of hydroxy and alkoxy groups, and hence, a substantial volume contraction to cause cracks at a coating thickness of 0.5 μm or more. When a functional film such as a filter or semiconductor has already been formed on the substrate, the firing can also cause damage to the functional film. However, the conversion of polysilazane to silica, based on the reaction mechanism to be described below, entails a weight gain and minimizes volume contraction, and the temperature at which conversion to the silica coating takes place is low enough for the resin film to withstand, causes few or no cracks, and provides minimized damage to the film formed as the undercoat.

Also preferably, the silica coating according to the invention contains UV-absorbing inorganic micro-particulates, typically zinc oxide (ZnO) microparticulates, so as to give a volume ratio of $SiO_2$/inorganic microparticulates in the range from 75/25 to 55/45. This adds a function of preventing UV degradation by light as a protective member.

The polysilazane used herein is a polymer having silicon-nitrogen bonds, that is, an inorganic polymer having Si—N, Si—H, N—H and other bonds as a precursor to ceramics such as $SiO_2$ and $Si_3N_4$. Most often, perhydro-polysilazane whose side chains are all hydrogen is used. Perhydropolysilazane is believed to have a structure consisting of straight chain structure segments and cyclic structure segments mainly of 6- and 8-membered rings. Its molecular weight corresponds to a number average molecular weight (Mn) of about 600 to about 2000 (calculated as polystyrene). Depending on the molecular weight, it is either liquid or solid.

Such polysilazanes are commercially available in the form of solutions in organic solvents, and such commercially available solutions can be used as the polysilazane-containing coating solution without further treatment. The organic solvents used herein include aromatic hydrocarbons such as toluene and xylene, aliphatic hydrocarbons such as hexane and octane, ethers such as dibutyl ether, and esters, but exclude alcohols. These solvents may be used in preparing the coating solution.

The content of polysilazane in the polysilazane-containing coating solution is about 0.2 to about 30% by weight although it differs depending on the desired thickness of the silica coating.

In the embodiment wherein the silica coating further contains UV-absorbing inorganic microparticulates, typically zinc oxide (ZnO) microparticulates, such microparticulates are added to the coating solution. The microparticulates preferably have a mean particle size of 0.01 to 0.5 μm and are contained in an amount of about 25 to about 35% by volume based on the polysilazane.

ZnO is unharmful as opposed to inorganic semi-conductor particles such as CdS, and remains durable in various environments as compared with organic particles. Besides, some organic UV absorbers are preferable. Such preferred UV absorbers are of the polymer type, that is, combinations of reaction type UV absorbers with polymers.

For example, the reaction type UV absorbers include an absorber of the following structure which is commercially available as RUVA-93 from Ohtsuka Chemical K.K.

The UV absorbers are also commercially available as copolymers with MMA or styrene. Examples include PUVA-30M and PUVA-30S from Ohtsuka Chemical K.K., which are commercially available in accordance with a particular purpose as PUVA-30M-30T, PUVA-50MBA-30T and PUVA-50MEH from Ohtsuka Chemical K.K.

These organic UV absorbers are used as a layer in combination with the silica coating, having a thickness of about 1 to about 15 μm.

Other useful UV absorbers are UV long wavelength-fluorescence converting organic compounds or organic metal complex molecules. Useful examples include rare earth planar complexes such as $[Tb(bpy)_2]Cl_3 \cdot xH_2O$ wherein bpy is 2,2'-bipyridine and $[Tb(phen)_2]Cl_3 \cdot xH_2O$ wherein phen is 1,10-phenanthroline, and a symmetric dicyanopyrazine derivative of the following structure.

As previously described, the polysilazane is a ceramic precursor polymer. To form a silica coating using polysilazane, firing in air at 450° C. or higher is needed. Nevertheless, by subjecting a wet coating of polysilazane to oxidation, that is, steam oxidation in the presence of a catalyst, a dense silica coating can be formed even at a temperature of 100° C. or lower and even on a less heat resistant support such as plastic film. In particular, by placing at 25° C. for 2 minutes the polysilazane coating solution (polysilazane having Mn of 100 to 50,000) in gas phase contact with a vapor (no phase) of a 5 wt % aqueous solution of trimethylamine as a catalyst and then holding in an atmosphere of 95° C. and RH 80% for 5 minutes, a silica-base ceramic is formed. This method enables continuous application and curing to a length of plastic film. Alternatively, a silica ceramic film is obtainable by heat reacting a polysilazane having Mn of 100 to 50,000 with an acetylacetonato complex (e.g., Ni, Pt, Pd, Al, Rh, etc.) to form a complex-added polysilazane fluid having a glycidol/polysilazane atomic ratio of from $1.0 \times 10^{-6}$ to 2 and Mn of about 200 to about 500,000, and firing the fluid at a low temperature of 50 to 350° C. Also, a silica ceramic film is obtainable by adding a metal (e.g., Ag, Au, Pd, Ni, etc.) having a size of less than 0.5 μm to a polysilazane having Mn of 100 to 50,000 and firing the mixture at a low temperature of 150 to 370° C. Specific steps are customarily carried out.

It is noted that the thickness of a wet coating is about 20 to 30% greater than the final coating thickness.

The coated article comprising a silica coating on a resin substrate according to the invention may sometimes consist of the resin substrate and the silica coating, although the article often has the silica coat-bearing resin substrate as a protective member, anti-reflection film or constituent member. Alternatively, in some cases, the article has the silica coat-bearing resin substrate as a passivation member between the substrate or an undercoat layer formed thereon having various functions and a functional film formed further thereon. Especially in the embodiment having the silica coat-bearing resin substrate as a protective member or anti-reflection film, usually the resin substrate is provided on one surface with the silica coating and on the opposite surface with a buffer adhesive layer whereby the substrate is joined via the buffer adhesive layer to a body on which the protective member or anti-reflection film is to be provided. Hereinafter, the resin substrate provided with the silica coating and the buffer adhesive layer is referred to as "silica coat-bearing hot melt web."

The buffer adhesive layer may be based on a thermoplastic resin, but preferably on a thermosetting resin. More preferably, the buffer adhesive layer contains a thermosetting resin and an organic peroxide.

For the buffer adhesive layer containing a thermosetting resin and an organic peroxide, the thermosetting resin component is exemplified by an ethylene-vinyl acetate (EVA) copolymer having a vinyl acetate content of about 15 to 50% by weight.

Any organic peroxide may be used as long as it is decomposed at a temperature above 80° C., especially above 90° C. to generate radicals. With stability during compounding taken into consideration, those organic peroxides having a decomposition temperature giving a half-life of 10 hours of at least 70° C. are preferred. Examples of thermosetting organic peroxide include 2,5-dimethylhexane-2,5-dihydroperoxide, 2,5-dimethyl-2,5-di(t-butylperoxy)hexane-3, di-t-butyl peroxide, 2,5-dimethyl-2,5-di(t-butylperoxy)hexane, dicumyl peroxide, α,α'-bis(t-butyl peroxyisopropyl)benzene, n-butyl 4,4-bis(t-butylperoxy) valerate, 2,2-bis(t-butylperoxy)butane, 1,1-bis(t-butylperoxy)-3,3,5-trimethylcyclohexane, t-butyl peroxybenzoate, and benzoyl peroxide. Any one of these peroxides may be used as well as a combination of two or more wherein they may be combined in any desired ratio. The amount of the thermosetting organic peroxide is preferably up to 10 parts by weight, and more preferably 0.5 to 6 parts by weight per 100 parts by weight of the polymeric component.

If necessary, additives such as curing accelerators may be added. For example, where the silica coat-bearing hot melt web is laminated to a body, it is effective to add an organosilane compound represented by an exemplary structure: $RSi(OR)_3$ wherein R is $C_2H_5$ to the buffer adhesive layer as a foam inhibitor or antifoaming agent in an amount of up to 6 parts by weight on the same basis as above. In the heating and pressurizing step, the organosilane compound reacts with the organic peroxide to generate free radicals and becomes a crosslinking agent for the main component, ethylene-acetate copolymer whereby it is incorporated into the buffer adhesive layer. When the silica coat-bearing hot melt webs are stacked or rounded for storage, the organosilane compound also has a function of preventing adhesion between the buffer adhesive layer and the back surface of the substrate and facilitating stripping.

The buffer adhesive layer is also endowed with a UV absorbing function by adding and dissolving the aforementioned reaction type UV absorber (e.g., RUV-93 by Ohtsuka Chemical K.K.) in a small amount of toluene so that it may react together with the EVA.

The thickness of the buffer adhesive layer may be adjusted as appropriate depending on the organic peroxide used, service environment, purpose and application, and is not critical. The thickness is preferably in the range of 3 to 500 μm, more preferably 3 to 50 μm, and most preferably 10 to 40 μm. At too small a thickness, the buffer adhesive layer may fail to provide a buffer effect. At too large a thickness, there may result a drop of light transmittance and frequent generation of burrs upon punching. It is noted that since the adhesive layer has an extremely high transmittance than the substrate, it can have a thickness of 10,000 μm at most, on use under high illumination, typically outdoor use. The buffer adhesive layer after heat lamination pressing should preferably have a dynamic modulus of up to $5\times10^9$ dyn/cm² at 20° C. and at least $1\times10^6$ dyn/cm² at 100° C., and especially $1\times10^9$ to $1\times10^6$ dyn/cm² at 20° C. and $2\times10^6$ to $1\times10^9$ dyn/cm² at 100° C. Preferably the heat lamination pressed adhesive develops a maximum peak of tan δ at a temperature below 20° C., especially in the range of −100° C. to +15° C.

Means for forming the buffer adhesive layer on the resin substrate include well-known methods such as coating and extrusion coating. The buffer adhesive layer and the resin substrate preferably have a total thickness of 10 to 600 μm, more preferably 10 to 120 μm, further preferably 30 to 90 μm, and especially 60 to 80 μm.

In the silica coat-bearing hot melt web according to the invention, the buffer adhesive layer is embossed or formed with impressions. The embosses or "impressions" as used herein are preferably provided, especially when the silica coat-bearing hot melt web according to the invention is laminated under pressure, as a pattern of streaks extending in the same direction as the transfer direction during lamination. In the case of adhesive joint, the embossing direction is arbitrary, and an optimum direction is selected in accordance with the joining direction and a member to be joined. By embossing or forming impressions, there are provided vents for bubbles to escape whereby the inclusion of bubbles is minimized. Particularly when pressure lamination is carried out by a roll laminator, the silica coat-bearing hot melt web as a laminate film is wrapped around a roll of the roll laminator and brought in nip contact with a body, so that air bubbles may readily escape in the laminating direction. The size and spacing (or population) of embosses or impressions are not critical although the preferred ranges are Ra=0.4 to 10 μm, especially 0.6 to 0.8 μm and an average peak-to-peak spacing of 50 to 180 μm, especially 60 to 140 μm. Embossing means is not critical, and direct embossing is carried out, or a release film is once embossed before the raised pattern is transferred.

Figure 1:
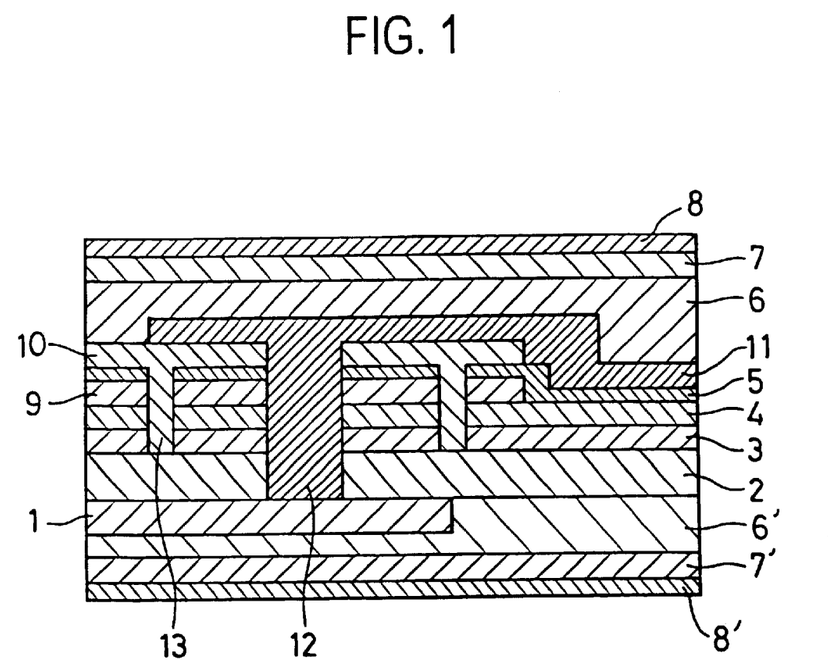
FIG. 1 is a schematic cross-sectional view showing one fundamental construction of a solar battery module according to the invention.

FIG. 1 shows one exemplary construction of a coated article obtained using the silica coat-bearing hot melt web according to the invention. FIG. 1 is a schematic cross-sectional view showing the basic construction of a solar battery module sheet as one exemplary construction of the coated article according to the invention. The solar battery cell includes on a flexible support 2, a lower electrode 3 of aluminum, a silicon layer 4 of amorphous silicon or the like, an interlayer insulating film 9 obtained by printing a first insulating resin composition of urethane or the like, a transparent electrode film 5 of indium tin oxide (ITO) or the like, open channels 13, a separator 10 obtained by printing a second insulating resin composition of urethane or the like, an interconnecting electrode 11, a through-hole 12, a positive tap electrode 1 formed by screen printing a silver paste to the back surface, and a negative tap electrode (not shown).

Disposed on the solar battery cell is the silica coat-bearing hot melt web consisting of a buffer adhesive layer 6, a substrate 7 and a silica coating 8 according to the invention. Where it is necessary, for outdoor use or other reasons, to prevent entry of water and dust or take a measure against the corrosion of the solar battery module by air-borne $O_2$ and $NO_x$ and industrial exhausted gases, the construction preferably further includes a buffer adhesive layer 6', a substrate 7' and a silica coating 8' below the cell. Especially the integral lamination of the buffer adhesive layer 6 with the silica coating 8-bearing substrate 7 ensures effective operation because the flexible rubber sheet-like adhesive layer 6 can be processed together with the silica coating 8-bearing substrate 7 as will be described later. The integral laminate is also effective in preventing dimensional deformation with time during operation which is otherwise caused by the release of internal strain in the buffer adhesive layer 6.

Preferably, the solar battery module sheet having the silica coat-bearing hot melt web laminated thereon is manufactured as follows.

The hot melt web is placed on a solar battery module sheet body (or a member to be laminated) such that the buffer adhesive layer of the former faces an upper (light receiving) surface or a surface-to-be-protected of the latter. Using a roll laminator or the like, heat pressing is carried out, preferably at a temperature of 100 to 120° C. and a linear pressure of 20 to 70 g/cm. Although reference is made herein to the one side lamination, a double side lamination is acceptable depending on the member to be laminated and the service environment. In the case of double side lamination, a sandwich of a member to be laminated between upper and lower hot melt webs, with the buffer adhesive layers facing the member, may be heat pressure bonded by means of a roll laminator or the like.

The resulting composite sheet is cut to a predetermined size and placed in a vessel equipped with heating and pressurizing means such as an autoclave. Heat and pressure are applied to the sheet preferably at a temperature of at least 70° C., especially 140 to 180° C. for 30 to 120 minutes, and preferably in a dry air or $N_2$ atmosphere, especially $N_2$ atmosphere, and further preferably by applying a substantially uniform mechanical pressure of 0.01 to 5.0 kg, especially 0.1 to 5.0 kg in a direction perpendicular to the composite sheet surface, that is, in a vertical direction (corresponding to a pressure of 3 to 15 kg/cm$^2$ during heating), thereby effecting heat crosslinking and debubbling and improving adhesion. There is obtained a laminated article as one form of the coated article according to the invention. In this case, the heating temperature and hydrostatic pressure of the heating and pressurizing means can be adjusted arbitrary in accordance with the member to be laminated and the hot melt web. Also the timing of mechanical pressure application is arbitrary although the mechanical pressure is preferably applied after heating and kept until cooling to room temperature. In the especially preferred procedure, the laminate is held at a temperature above the curing temperature of the adhesive layer, more specifically 70 to 100° C. and a pressure of 5 to 10 kg/cm$^2$ for 15 to 60 minutes for debubbling before thermosetting is effected by holding at a temperature above the curing temperature of the adhesive layer, more specifically at 100 to 170° C., especially 120 to 170° C., and a pressure of 3 to 15 kg/cm$^2$, especially 5 to 10 kg/cm$^2$, for 5 to 60 minutes, especially 15 to 60 minutes.

The laminating operation using a roll laminator minimizes the influence of protrusions and impressions on the member to be laminated such as a fine pattern of interdigital electrodes or a fine pattern for isolation and insulation between cells in solar batteries and the like. When the buffer adhesive layer which increases fluidity when heated in contact with the structural surface of the member to be laminated is fed in nip contact between the elastic rolls of the roll laminator, bubbles which tend to remain in the shadow of the pattern on the structural surface are effectively extruded out by hydraulic forces due to shear stresses between the elastic rolls.

Those bubbles which have not been completely removed by the roll laminator are removed in the heat crosslinking step by the heating and pressurizing means. In one procedure preferred with this regard, a heat resistant elastic member sheet is placed on the upper (or light receiving) surface of the composite sheet, a metal plate is placed thereon, and a pressure is mechanically applied to a stack of a plurality of such sets in a vertical direction by pressurizing means such as a pneumatic cylinder (via a rigid, flat, smooth plate such as a stainless steel plate). Then, the module in which various functional thin films lying on a plastic support have been arbitrarily deformed by heat shrinkage and internal stresses becomes a device which is laminated and corrected to be smooth and flat.

In this way, a mechanical pressure is applied to a laminate structure as mentioned above in the heat crosslinking step with the aid of heat and pressure, whereby sheets each having a plurality of distinct components having different rigidity and gage such as amorphous silicon, ITO, aluminum alloy, interlayer insulating film, and sealing insulating protective film as in a solar battery are laminated and integrated into a composite sheet which is corrected for random deformation although each layer as finally deposited has a different thermal shrinkage factor and internal stress. In addition, since a plurality of such composite sheets are stacked, a number of flattening and correcting operations are carried out at the same time, which is advantageous for mass production. As compared with coating, the laminate pressing can produce a product having a fully flat and smooth surface and a satisfactory outer appearance, indicating the potential and advantageous application to high value-added commodities.

The heat resistant elastic member sheet to be overlaid is not critical as long as it withstands the heating temperature. A choice may be made among well-known heat resistant elastic members. Such elastic members include heat resistant silicone rubber, fluororubber (Vyton) and fluorosilicone rubber. The thickness of the elastic member sheet is usually in the range of 0.5 to 10 mm though not limited thereto.

The metal plate to be overlaid includes aluminum, stainless steel, brass and steel plates, with aluminum plates being preferred because of the light weight and good heat transfer. The thickness of the metal plate is usually in the range of 0.2 to 3 mm though not limited thereto. These metal plates may be surface treated by well-known means, for example, aluminizing, chromium, nickel or nickel-chromium plating, and coating.

Figure 2:
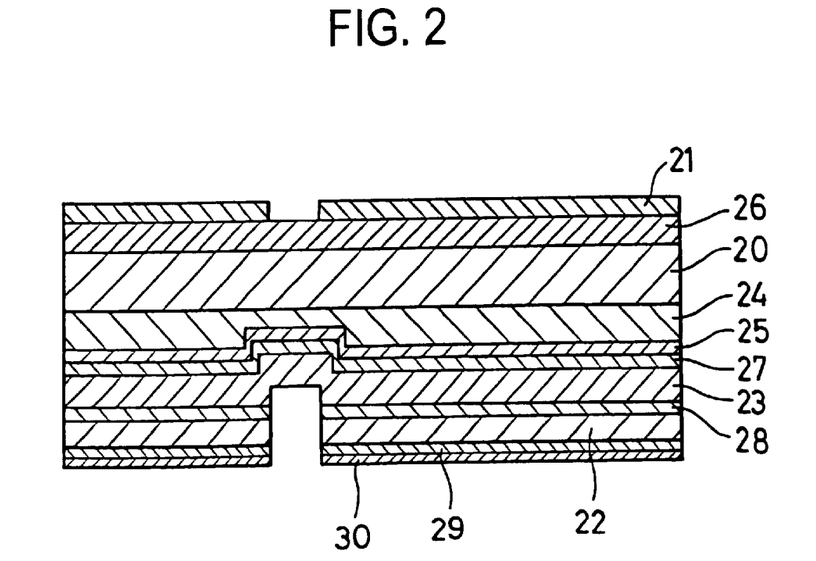
FIG. 2 is a schematic cross-sectional view showing another fundamental construction of a solar battery module according to the invention.

Another construction of the solar battery module sheet is shown in FIG. 2.

Shown in FIG. 2 is a solar battery-constructing cell of the transparent film support back side integrated structure in which silica coatings (containing ZnO UV shielding agent) 24, 26 are formed on opposite surfaces of a transparent base film 20 of PEN or the like by steam oxidizing of polysilazane, and a transparent conductive layer 25 of ITO, a ZnO layer 27, an a-Si layer 23, and a transparent conductive layer 28 of ZnO containing 1 to 10 wt % of Ga (intended for light confinement effect and preventing devitrification of ITO upon exposure to hydrogen-containing plasma atmosphere during formation of a-Si layer), and an underlying metal electrode 22 of aluminum are deposited below the silica coating 24. As shown in the figure, a protective member comprising a transparent resin film 29 and a silica coating 30 formed thereon from polysilazane may be disposed below the underlying aluminum electrode 22 for protecting the same.

In such a structure, the protective film for the photoelectric conversion device formed on the back surface of the transparent base film serves to block the device from the ambient temperature, humidity and gas components, ensuring the life and reliability of the device. To form a good ohmic contact with the ITO/ZnO transparent electrode and to reduce the light absorption loss, the a-Si layer as the photoelectric conversion film is preferably deposited in the form of microcrystalline silicon by hydrogenation of amorphous silicon ($\mu$c-Si:H) (a dopant such as B or P is added to H for valence electron control to form a p- or n-type layer, obtaining a silicon base photoelectric conversion film of more efficient pin junction) although the support must be heated at 100 to 200° C. during deposition. In this case, as a passivation film for restraining release of oligomers from within the substrate or PEN film, and outgassing of absorbed water component, air and gases within the film during vacuum deposition, typically plasma CVD, and in order to improve the heat resistance of PEN substrate surface, the above-mentioned silica coating or thin film is formed on one surface or opposite surfaces of the substrate film. This measure is effective for improving the performance of the Si photoelectric conversion film and the uniformity and environmental reliability of the constituent thin films of the solar battery device including a transparent electrode film, metal electrode film, interlayer insulating film, and conductive interconnecting electrode film. The function as a passivation film during vacuum deposition (especially deposition by plasma CVD) is effective not only on the water absorbing, moisture permeable, oxygen permeable resin film, but also on general resin or plastic films. Further, when such a plastic substrate is used, the effects of heat resistance, high Young's modulus and hardness the silica coating possesses help the plastic substrate withstand the heating of a support during a-Si deposition, resulting in a coating of high quality while restraining the softening, heat contraction and heat expansion of the substrate to keep the substrate in a sound form free of curl or waviness.

Although the coated article of the invention is advantageously applied to the solar battery module as mentioned above, it is also applicable to a variety of electronic devices requiring weather resistance and the like. The silica coat-bearing resin substrate is also usable as a protective film or member on optical discs, liquid crystal displays, and EL displays (for example, passivation between the substrate or an optical functional film formed thereon and an organic layer (light emitting layer), electrode layer or the like).

The silica coat-bearing resin substrate can also be used in the agricultural application as a vinyl chloride substitute for green houses. The use of polymethyl methacrylate resin as the resin substrate is advantageous because the burden on the environment imposed by the disposal of used articles by incineration is reduced.

EXAMPLE

Examples are given below together with Comparative Examples for further illustrating the invention.

Example 1

First, as shown in FIG. 1, a lower electrode 3 of aluminum (or aluminum/stainless steel laminate) was formed on a flexible support 2 of polyethylene naphthalate (PEN) film. Then, an amorphous silicon layer 4 having a pin junction and photovoltaic force was formed by a plasma CVD technique. Using a 150-mesh polyester screen, a first urethane base insulating resin composition was printed and patterned on the surface of the amorphous silicon layer 4. This was dried and thermoset in an oven at 160° C. for 10 minutes, forming an interlayer insulating film 9. An ITO transparent electrode film 5 was deposited thereon by a sputtering technique using indium tin oxide (ITO) as a target and argon sputtering gas. Next, by a laser scribing technique of forming channels and through-holes for electrical insulation or interconnection purposes using a YAG laser, open channels 13 were formed through the interlayer insulating film 9, ITO transparent electrode 5, amorphous silicon layer 4, and lower electrode 3. Further, a second urethane base insulating resin composition was screen printed over the channels 13, forming a separator 10 for providing insulation between the lower electrode 3 and the ITO transparent electrode 5. A conductive carbon paste was similarly printed thereon to form an interconnecting electrode 11. At the same time, the through-hole 12 formed through the support by laser scribing was filled with the conductive carbon paste. Finally, a carbon electrode was formed on the back surface by screen printing so as to come in contact with the conductive silver paste in the through-hole. A positive side tap electrode 1 and a negative side tap electrode (not shown) are formed, obtaining a solar battery module.

In an application where a decorative design feature is strictly required as in solar power generation watches (see Japanese Patent Application No. 11-220916) and in an outdoor or indoor application (like signs) where design matching with the surrounding is required, it is desirable to form a color interlayer insulating film whose color tone is controlled so as to give a color difference $\Delta E$ (based on the Lab color space) of up to 5, preferably up to 3, more preferably up to 2, from the interference reflection color that the transparent electrode thin-film (of ITO, ZnO, etc.) exhibits or the watch dial plate, and to cover the surface of an interconnecting electrode of conductive silver paste having a high reflectance with the color insulating film. Where photo-generation under indoor low-luminance conditions is mainly required as typified by solar battery power sources for watches and multifunction remote controllers, a minute short-circuit region is often formed between the transparent electrode and the back side electrode by electrostatic breakdown, resulting in a lowering of output voltage, instability and a substantial lowering of product reliability. One countermeasure is an interconnecting electrode for increasing the resistance of the conductive electrode portion (inclusive of back side electrode) or light-receiving side transparent electrode for thereby weakening the concentration of an electric field at the device adding and dispersing microparticulate silica (e.g., Aerosil) on top of the interconnecting electrode to impart a certain degree of light diffusion for diffusing incident light, thereby making unnoticeable the color difference between the power generating film covered with ITO thin film and exhibiting an interference color and the remaining portions. At the same time, it is preferred to form a transparent sealing resin protective film or a microparticulate silica film by screen printing a light transmissive ink having dispersed therein microparticulate silica and endowed with an output improvement due to the optical confinement effect of incident light over the entire surface including the wiring electrode, and thermosetting it into a tough protective film of about 5 to 30 μm thick (see JP-A 11-220916). In this case, conductive carbon, graphitized carbon, microparticulate artificial graphite, or a conductive carbon base power mixture having a higher resistance than silver powder (e.g., a mixture of carbon powder (highly conductive black #3950 by Mitsubishi Chemical K.K.) and microparticulate artificial graphite (graphite powder CPB-5000 by Chuetsu Graphite K.K.) in a weight ratio from about 1/3 to about 3/1, having a particle size of 0.1 micron to several tens of microns) is added to a resin solution (paste) in a concentration of 25 to 40% by volume so as to provide a resistance of about 10 to 100 ohms per square approximate to that of the ITO transparent conductive film; the mixture is thoroughly milled and mixed in a dispersing machine. Then a solution of a polyester resin (especially a mixture of high OH equivalent polyesters such as Viron #220 and #630 by Toyobo K.K.), polyurethane resin, epoxy resin or phenoxy resin dissolved in a high-boiling solvent for screen printing is added, followed by through dispersion and mixing. Then an isocyanate (trifunctional isocyanate hexamethylene diisocyanate (HDI) triazine ring-containing adduct, Colonate HX by Nippon Polyurethane K.K.) in an amount of at least 1.2 equivalents based on -OH groups in the resin is used as a two-part mixing type curable ink. Similarly, a blocked isocyanate in which a polyfunctional isocyanate is blocked with an acetoacetate (acetoacetate-blocked HDI by Asahi Chemical K.K.) is previously added to the above solution and used as a one-part type curable ink. Alternatively, butylated melamine, methylated melamine or the like in an amount of about 20% by weight of the resin value may be used as a two-part mixing type curable ink. In this case, thermosetting is effected in a nitrogen or air atmosphere at 160° C. for 20 minutes. The ink film as cured must be a solvent resistant, fully cured conductive film having a Tg of at least 60° C., and in the sense that even when the above-mentioned transparent resin sealing film is printed thereon, the carbon based conductive ink film is not swollen with the solvent (e.g., γ-butyrolactone) and does not increase the series resistance with the ITO (or ZnO) interface (that is, a good ohmic contact is established between a transparent electrode and a carbon electrode by filling a highly crosslinkable saturated polyester resin with a carbon/microparticulate graphite mixture having a low sheet resistivity in a high concentration (30% by volume based on the carbon electrode of the carbon/microparticulate graphite mixture) and crosslinking with the isocyanate and melamine resin to a high density, contributing to an improvement in cell performance). For solar batteries for indoor application, this sealing resin film fully insures a reliable performance life of about 3 years.

For solar batteries for outdoor application where they are exposed to a rigorous environment including wind, rain and UV radiation, the invention is applied.

As the substrate 7 (7') of resin film having light transparency, heat resistance and flexibility, there was furnished a polymethyl methacrylate resin film of 125 μm thick (Technolloy R526 by Sumitomo Chemical K.K., heat resistant PMMA composition, Tg 101–105° C.).

A coating solution was prepared by dispersing ZnO microparticulates (mean particle size 0.02 to 0.03 μm) as UV-absorbing inorganic microparticulates in a dibutyl ether solution of perhydropolysilazane with Mn=800 (concentration 20 wt %, N-V110 by Tonen K.K.).

The coating solution was diluted with dibutyl ether, and applied onto one surface of the resin film substrate 7 (7') to a wet thickness of 0.6 μm using a thin layer coater such as a die coater, flexo-coater or gravure coater. The coated film was dried in hot air, in-line annealed at 150° C., and wound up into a roll. Next, the roll was continuously subjected to steam oxidization for one hour in an atmosphere of 90° C. and RH 80%. Immediately after the steam oxidation, a small amount of a 5 wt % aqueous solution of trimethylamine as a catalyst was sprayed to the roll whereby conversion to a silica coating was effected at 90° C. and RH 80%. The film was continuously heated at 110° C. for completely removing the water and wound into a roll again. In this way, a silica film 8 (8') of 0.5 μm thick was formed. ZnO was added to the coating solution in such an amount that the silica film may have a $SiO_2$/ZnO ratio of from 70/30 to 65/35 by volume. The polymethyl methacrylate film bearing the silica coating was confirmed by observation under a spectrophotometer that the film transmittance at a wavelength of less than 400 nm is cut about 95% due to the effect of ZnO.

With respect to the water absorption of PMMA film from the exterior in an outdoor weathering test, etc., the passivation effect of the dense silica coating prevents water from penetrating into the interior of the PMMA film, thereby preventing the corrosion or degradation of the power generating film and electrode films, providing a laminate sealing film having minimized deterioration of current-to-voltage (IV) characteristics, as will be shown by the results of a weathering test on a solar better module sheet.

As the buffer adhesive layer 6 (6'), a coating solution was prepared by adding 7 parts by weight of a dicumyl peroxide as an organic peroxide curing agent to 100 parts by weight of an ethylene-vinyl acetate copolymer resin (EVA: vinyl acetate content about 15 to 50% by weight) and further blending a minor amount of a curing accelerator and additives such as ethyltriethoxysilane for imparting debubbling and parting properties. This is applied to one surface of the resin film substrate 7 (7') to a thickness of 30 μm, obtaining the buffer adhesive layer 6 (6').

The buffer adhesive layer on the surface is embossed to form impressions having Ra=0.65 μm, Rz (ISO)=2.65 μm, Sm=128 μm and S=37 μm as measured by a surface roughness meter, obtaining a silica coat-bearing film-shaped hot melt web.

It is noted that when a benzotriazole UV absorber such as Sumisoap 250 by Sumitomo Chemical K.K. has already been incorporated in the substrate film or when a buffer adhesive has a full UV radiation cutting effect (due to the use of a reaction type UV absorber RUVA-93 by Ohtsuka Chemical K.K.), the addition of ZnO is not particularly needed, and such a construction is preferable in forming a more dense silica coating.

The buffer adhesive layer sides of the thus obtained silica coat-bearing film-shaped hot melt webs are mated with the light-receiving side (ITO transparent electrode film side) and the back side (flexible support side) of the solar battery module and lamination pressing is effected from opposite sides by continuously moving them in close contact along the circumferential surfaces of elastic heat resistant rubber rolls of a roll laminator at a heat resistant rubber roll temperature of 110° C. and a linear pressure of 40 g/cm. The composite sheet is wound in a roll, obtaining a composite solar battery module.

The thus obtained composite solar battery module was cut to a predetermined size. On the light-receiving side (on the side of the silica coating 8 on the resin protective film 7) of the cut section, a piece of heat resistant silicone rubber of a similar size and 5 mm thick was placed. An aluminum plate of a similar size was further placed thereon to form a set of laminated layers. A stack of 30 sets was placed between stainless steel plates coupled to a pneumatic cylinder in an autoclave.

By applying a pressure of 0.3 kg/cm² by means of the pneumatic cylinder, closing the autoclave, filling $N_2$ gas, and heating at 90° C., holding at the temperature for 30 minutes, then heating at 100° C. and holding at the temperature for 45 minutes, there is obtained a laminated article of the invention, that is, a solar battery module sheet. The internal pressure was 7 kg/cm².

Thirty (30) samples of the thus obtained solar battery module sheet were visually observed, finding no bubbles, good outer appearance, and good adhesion between the laminate layer and the solar battery light-receiving surface due to thermosetting. The samples were examined for initial battery characteristics and by storage environment accelerated deterioration test. Specifically, a short-circuit current density (Isc), open circuit voltage (Voc), equipment connected current (Iope) and shape factor (FF) were examined by an a-Si solar battery light deterioration accelerated test prescribed by JOA by concentrating 3 folds a xenon lamp having a spectrum close to that of sunlight and overlapping support heating and a shower test and continuing the test for 1,800 hours. The testing machine used as Xenon Weatherometer XER-W73 by Iwasaki Electric K.K. with continuous illumination being employed. The luminance of irradiation was 180 W/m² in the wavelength range of 300 to 400 nm. The heating temperature of the substrate was 63° C. The showering was 18 minutes every 2 hours. The results are shown below.

|  | Initial | After 1800 hr |
|---|---|---|
| Isc (mA) | 200 | 191 |
| Voc (mV) | 5.2 | 5.0 |
| Iope (mA) | 176 | 165 |
| FF | 0.53 | 0.50 |

It is seen that properties deteriorated little under rigorous conditions, indicating a significant improvement in weathering.

Comparative Example 1

Samples were fabricated as in Example 1 except that the silica coating was omitted. They were examined for properties, with the results shown below.

|  | Initial | After 1800 hr |
|---|---|---|
| Isc (mA) | 210 | 111 |
| Voc (mV) | 5.1 | 3.8 |
| Iope (mA) | 175 | 98 |
| FF | 0.53 | 0.29 |

It is seen that properties largely deteriorated as compared with the samples of Example 1. Since the blocking of water by the silica coating is not accomplished, the PMMA film on the light-receiving side had large cracks and was significantly deteriorated under rigorous conditions including water absorption of the film, UV light and heat.

Example 2

An ethylene-tetrafluoroethylene copolymer resin film having a fluorine content of 40 to 60% by weight (ETFE: Aflex 100N, gage 100 μm, double side quick adhesive coated, by Asahi Glass K.K.) was used instead of the polymethyl methacrylate resin film (Tg 101° C.) used in Example 1. On one surface of the film a silica coating (without adding ZnO) was formed as in Example 1. Thereafter, a 30 wt % coating solution containing a copolymer resin (a weight average molecular weight Mw of 60,000 to 70,000) consisting of 50 parts of benzotriazole reactive UV absorber (RUVA-93 by Ohtsuka Chemical K.K., 3-(2H-1,2,3-benzotriazol-2-yl)-4-hydroxyphenethyl methacrylate) and 50 parts of MMA in toluene was applied thereon by means of a gravure coater to a (dry) thickness of 10 μm. This film was found to completely cut UV of shorter than 380 nm.

On the uncoated surface of the ETFE film, a composition comprising the buffer adhesive EVA used in Example 1, a crosslinking catalyst (dicumyl peroxide, 7 wt % per 100 parts by weight of EVA) and a reactive UV absorber RUVA-93 in an amount of 10 parts by weight per 100 parts by weight of EVA, ethyl trixylene and other additives was coated to a thickness of 30 μm, obtaining a laminate film. Such laminate films were roll laminated, and cured in an autoclave at a maximum temperature of 160° C., achieving laminate sealing of a solar battery module sheet. The results of the weathering test on this are little deterioration of IV properties as in Example 1, indicating sufficient advantages as a protective film.

It is noted that as compared with the ETFE film of Example 2, the sample of Example 1 using silica coat-bearing PMMA film can be disposed of by incineration and is advantageous for the protection of the global environment. The ETFE polymer itself is very stable and nontoxic, but gives off harmful hydrogen fluoride gases upon incineration for disposal, which are toxic to lives and damage the incineration furnace. This requires the incineration furnace to take a countermeasure and is detrimental to the protection of the global environment.

Example 3

Instead of vinyl chloride film as a film for green houses, there was used a polymethyl methacrylate film (Technolloy R526 by Sumitomo Chemical K.K.) of 125 μm having incorporated therein a benzotriazole UV absorber similar to Sumisoap 250 (Sumitomo Chemical K.K.) which was coated with a silica coating of 0.5 μm originating from polysilazane as in Example 1. Using this film, a green house was constructed.

As compared with the vinyl chloride film, the inventive film had a lifetime of about 5 folds. When incinerated, the film gave off no harmful gases such as dioxin and was least toxic.

The silica coat-bearing PMMA film had substantially improved weather resistance as compared with the conventional agricultural vinyl chloride, and exhibited in an actual exposure test a transmittance of overall light, haze stability and minimized strength deterioration, comparable to ETFE (Aflex 100N, 100 μm thick, by Asahi Glass K.K.). This means that the water absorbing drawback of PMMA film is eliminated by the silica coating resulting from application of polysilazane and serving as a passivation film between the film surface and the surrounding, and the penetrating UV radiation is cut by ZnO, the latter being rather superior to the original ETFE. In addition, the PMMA film has a lower film cost than ETFE and is disposed of by incineration without harmful pollution.

Figure 3:
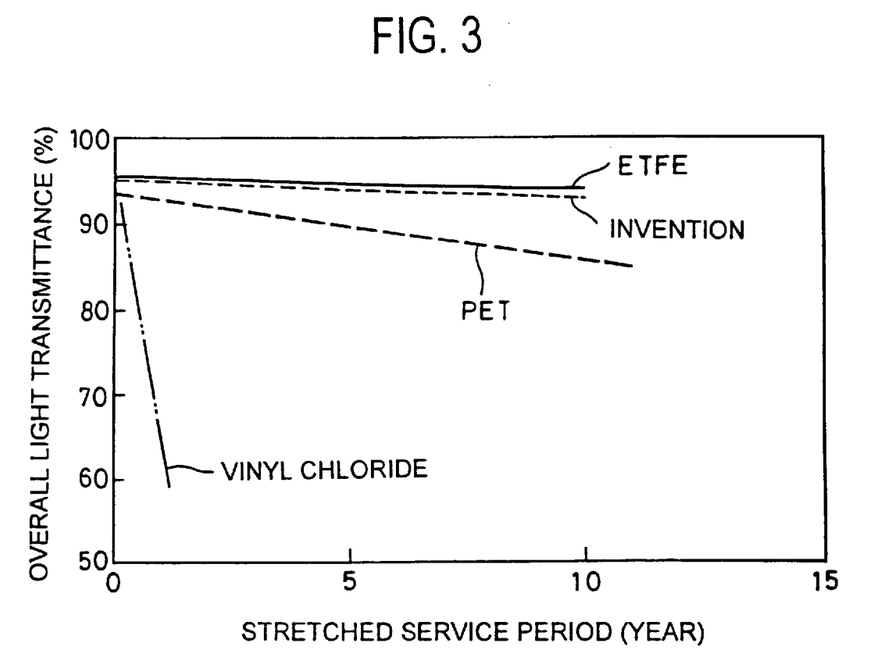
FIG. 3 is a graph showing an overall light transmittance (%) as a function of a stretched service period (years).
Figure 4:
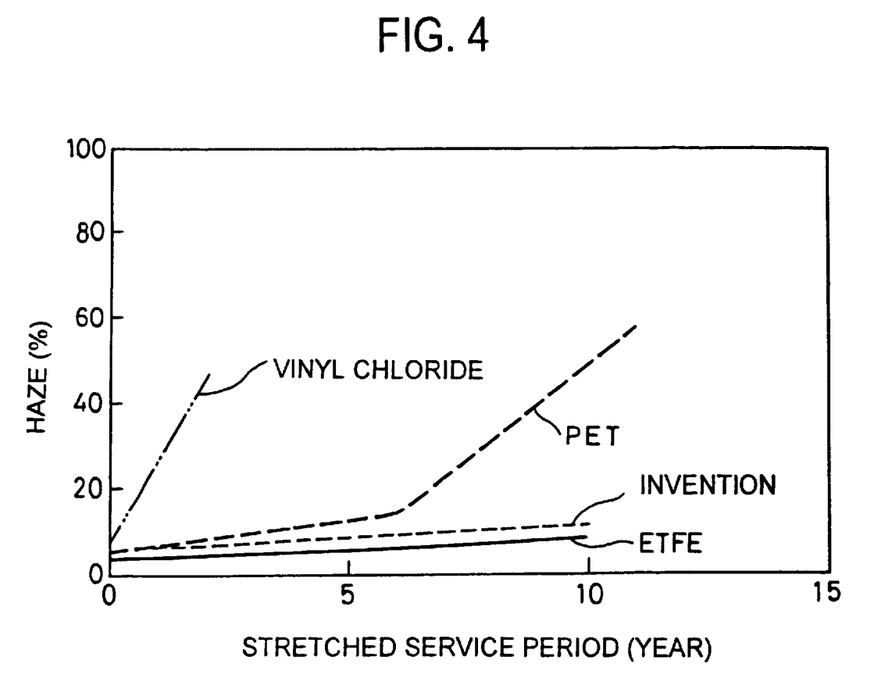
FIG. 4 is a graph showing a haze (%) as a function of a stretched service period (years).
Figure 5:
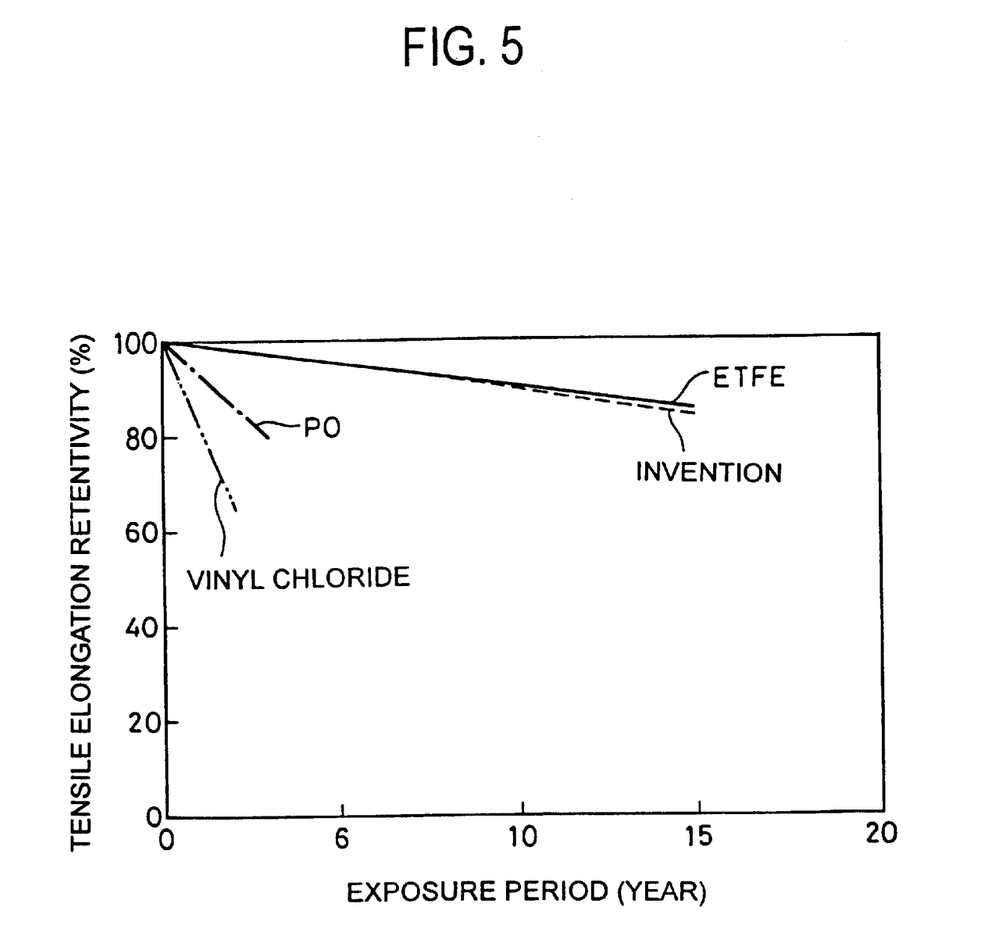
FIG. 5 is a graph showing a tensile elongation retentivity (%) as a function of an exposed period (years).

Regarding the PMMA film bearing a silica coating having a UV absorbing function (125.5 μm thick), agricultural vinyl chloride (100 μm thick), ETFE film (60 μm thick), FIGS. 3 to 5 show a transmittance (%) of overall light, haze (%) and tensile elongation retentivity (%) as a function of a stretched service period (year). With respect to the overall light transmittance (%) and haze (%), the results of PET film (Mylar by E. I. Dupont, 150 μm thick) are also shown; and with respect to the tensile elongation retentivity (%), the results of polyolefin (PO) film (high-density polyethylene film by Mitsui Chemical K.K., 30 μm thick) are also shown for reference purposes.

For the silica coat-bearing PMMA film and ETFE film, the results (mechanical properties) of an outdoor exposure test are shown in Table 1.

TABLE 1

| Mechanical strength | | Film | Before exposure test | 15 years after exposure test |
|---|---|---|---|---|
| Tensile strength (kg/mm$^2$) | MD | ETFE | 6.4 | 5.8 |
| | | Invention | 5.8 | 5.1 |
| | TD | ETFE | 6.6 | 5.9 |
| | | Invention | 5.4 | 4.9 |
| Tensile elongation (%) | MD | ETFE | 420 | 360 |
| | | Invention | 35 | 30 |
| | TD | ETFE | 440 | 370 |
| | | Invention | 31 | 28 |
| Yield strength (kg/mm$^2$) | MD | ETFE | 2.7 | 2.8 |
| | | Invention | 6.6 | 6.5 |
| | TD | ETFE | 2.6 | 2.7 |
| | | Invention | 6.1 | 6.0 |

MD: machine direction
TD: transverse direction

The effectiveness of the invention is evident from FIGS. 1 to 3 and Table 1.

Example 4

The substrate used herein was a polyarylate resin sheet which was 200 μm thick, colorless, transparent as shown by an overall light transmittance of higher than 90% and heat resistance as shown by a Tg of 288° C. (MF-2000 by Unitika K.K.). A 20 wt % dibutyl ether (DBE) solution of polysilazane (D820 by Tonen K.K., containing amine catalyst) was applied to opposite surfaces of the substrate by a dip coating technique, dried by heating, fed into a clean oven in which humid air obtained by bubbling air into pure water was maintained at 200° C. Steam oxidation was carried out in the oven by heating for 2 hours. Next, in an air atmosphere, heat treatment was carried out at 230° C. for one hour, obtaining a flexible transparent support having dense silica layers of about 0.5 μm thick on opposite surfaces of the support.

Next, a pattern was formed on the support, using color filters by Fuji Hunt K.K. as a blue transmitting layer, a green transmitting layer, and a red transmitting layer. The green filter cuts light of 560 nm or longer wavelengths and 480 nm or shorter wavelengths, the blue filter cuts light of 490 nm or longer wavelengths, and the red filter cuts light of 580 nm or shorter wavelengths.

Next, a coating solution of perhydropolysilazane (Mn= 1000) in xylene (concentration 20 wt %, L110 by Tonen K.K., containing Pd catalyst of several tens of angstroms) was applied onto the color filter pattern-formed support by means of a thin-film coater such as a spin coater, die coater, flexo-coater or gravure coater, especially a spin coater, to form a silica coating having a final thickness of about 0.5 μm. After hot air drying, as was the above support, steam oxidation was carried out in a clean oven by feeding water-bubbling air and heating at 200° C. for 30 minutes to one hour. The support was then heat oxidized and dehydrated on a hot plate at 230° C. for one hour. At this point, the Pd catalyst contained helped the perhydropolysilazane be converted into a silica coating during heating and steam oxidation. Subsequently, continuous heating at 230° C. was effected to completely remove the water, forming a silica film of 0.5 μm thick or a barrier layer having a dense silica film.

Further, ashing was carried out for 10 minutes by an oxygen plasma (2 kV output, support temperature 200° C.). This treatment further cleaned the surface of the barrier layer also serving as an overcoat on the color filters, forming a more flat, complete a-SiO$_2$ passivation layer.

Next, an ITO transparent electrode (hole injecting electrode) of 85 nm thick was deposited and patterned so as to define a pixel matrix of 64 dots×7 lines (100×100 μm per pixel). The substrate having the patterned hole injecting electrode formed thereon was subjected to ultrasonic cleaning using neutral detergent, acetone and ethanol, pulled up from boiling ethanol, and dried. This was followed by UV/O$_3$ cleaning.

Next, the support was transferred to a deposition chamber and secured by a holder in a vacuum evaporation chamber, which was evacuated to $1\times10^{-4}$ Pa or lower. Then, poly (thiophene-2,5-diyl) was deposited to a thickness of 10 nm as a hole injecting layer, and TPD doped with 1 wt % of rubrene was co-evaporated to a thickness of 5 nm as a hole transporting layer and yellow light emitting layer. The concentration of rubrene is preferably about 0.1 to abut 10% by weight, within which light emission occurs at a high efficiency. The concentration may be determined in accordance with a color balance of light emission and also governed by the light strength and wavelength spectrum of a blue light emitting layer to be subsequently deposited. Then 4'-bis[(1,2,2-triphenyl)ethenyl]biphenyl was deposited to 50 nm as a blue light emitting layer and Alq3 deposited to 10 nm as an electron transporting layer.

Next, AlLi (Li 7 at %) was evaporated to a thickness of 1 nm and an aluminum electrode layer was deposited to a thickness of 200 nm. Prior to sealing as an organic EL display, a desiccant (CaH$_2$) mixed with silicone rubber for fixation was placed, and finally a seal was formed with a PCTFE film of 100 μm thick (ETFE did not contain UV absorber as used in Example 2) coated with EVA, completing an organic EL display. The PCTFE film is superior in water absorption and steam permeability to ETFE.

As a comparative sample, a sample without a barrier layer (Sample #A) was prepared by using the polyarylate resin sheet in Example 4 as the support, forming color filters directly thereon, applying an acrylic resin to a thickness of 5 μm, heating at 150° C. for heat curing, and forming an overcoat layer.

Each of the thus fabricated organic EL color displays was continuously driven by applying a dc voltage and a constant current density of 50 mA/cm$^2$. The inventive sample had a luminance half-life of more than 400 hours whereas comparative sample #A had a half-life of less than 50 hours. It is seen from these results that the provision of the barrier layer according to the invention ensures a life at least comparable to the prior art display having both the overcoat layer and the barrier layer. It is noted that substantially equivalent results were obtained when both a color filter layer and a fluorescent conversion filter layer were used in combination.

The resulting organic EL display is lighter weight than conventional displays using glass supports and sealing glass supports including the comparative sample, and resistant against damages (e.g., panel cracking) by impacts Therefore, it is useful as a display for portable equipment.

Benefits of the Invention

The invention makes it possible to provide a coated article having improved light transparency, heat resistance, and weather resistance and ease of preparation and useful as a protective member so that when applied to solar battery modules, no or little loss of performance occurs during long-term outdoor installation.

The coated article protects functional films or devices from water vapor and gases so that the life of functional films or devices is dramatically improved.

What is claimed is:

1. A coated article comprising a substrate made of a resin having light transparency and heat resistance, stainless steel base metal material or glass, and a silica coating formed on at least one surface of the substrate by applying a polysilazane-containing coating solution under atmospheric pressure, followed by oxidizing treatment, wherein said silica coating layer further contains a UV long wavelength-fluorescence converting organic compound or organic metal complex molecule.

2. The coated article of claim 1 wherein the polysilazane is perhydropolysilazane.

3. The coated article of claim 1 wherein said silica coating has a thickness of 0.01 to 15 µm.

4. The coated article of claim 1 wherein said substrate is made of a resin having a glass transition temperature of at least 65° C. or a heat resisting temperature of at least 70° C.

5. The coated article of claim 1, wherein said substrate is made of at least a polymethyl methacrylate resin, polycarbonate resin, amorphous polyolefin resin or polyester resin.

6. The coated article of claim 1 wherein said silica coating is formed on a top and/or a bottom surface of said substrate for blocking the discharge of an outgassing component or oligomer in the substrate made of a water absorbing, moisture permeable or oxygen permeable resin film, so that the coated article functions as a passivation film and is used as a substrate for vacuum deposition.

7. The coated article of claim 1 wherein said silica coating is formed on a top and/or bottom surface of said substrate, wherein by virtue of the heat resistance, modulus of elasticity and low heat shrinkage factor of said silica coating, when another functional film is deposited and laid thereon under atmospheric pressure or vacuum, the coated article serves as a film depositing substrate capable of maintaining dimensional precision, suppressing heat deformation and maintaining flatness of the substrate.

8. A solar battery module comprising the coated article of claim 1.

9. The solar battery module of claim 8 wherein said substrate has the silica coating on one surface thereof and a buffer adhesive layer on another surface thereof, and said module has the silica coat-bearing substrate attached as a protective member through the buffer adhesive layer.

10. The solar battery module of claim 9 which has the protective member on at least a light-receiving side.

11. The solar battery module of claim 10 which has the protective member on both the light-receiving side and an opposite side.

12. The solar battery module of claim 8 wherein said substrate is made of a stainless steel base metal material and said silica coating is formed on a top and/or a bottom surface thereof as an insulating flat film.

13. The solar battery module of claim 8 wherein said substrate is made of soda glass and said silica coating is formed on a top and/or a bottom surface thereof as a $Na^+$ non-migrating film.

14. An organic EL device comprising the coated article of claim 1.

15. A method comprising applying on at least one surface of a substrate made of a resin having light transparency and heat resistance, stainless steel base metal material or glass a polysilazane-containing solution under atmospheric pressure followed by steam oxidation treatment, wherein said polysilazane-containing solution further contains a UV long wavelength-fluorescence converting organic compound or organic metal complex molecule.

16. The method according to claim 15, wherein said steam oxidation is carried out in the presence of a catalyst.

17. The method according to claim 16, wherein the temperature is 100° C. or lower.

18. The method according to claim 17, wherein said polysilazane is continuously applied to a length of said substrate.

* * * * *